(12) United States Patent
Wang et al.

(10) Patent No.: US 8,829,581 B1
(45) Date of Patent: Sep. 9, 2014

(54) RESISTIVE MEMORY DEVICES

(71) Applicant: Hewlett-Packard Development Company, L.P., Houston, TX (US)

(72) Inventors: Shih-Yuan Wang, Palo Alto, CA (US);
Jianhua Yang, Palo Alto, CA (US);
Alexandre M. Bratkovski, Mountian View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/866,625

(22) Filed: Apr. 19, 2013

(51) Int. Cl.
*H01L 29/76* (2006.01)
*H01L 45/00* (2006.01)
*B82Y 99/00* (2011.01)

(52) U.S. Cl.
CPC ............ *H01L 45/1253* (2013.01); *H01L 45/04* (2013.01); *H01L 45/16* (2013.01); *B82Y 99/00* (2013.01)
USPC ........................ 257/295; 438/3; 257/E27.047

(58) Field of Classification Search
CPC .................................. H01L 45/04; H01L 27/24
USPC .................... 257/4, 295, E27.047; 438/3, 104
See application file for complete search history.

(56) References Cited

U.S. PATENT DOCUMENTS

| 8,173,987 B2 | 5/2012 | Lung |
| 8,206,995 B2 * | 6/2012 | Reyes et al. ........................ 438/3 |
| 2012/0061637 A1 | 3/2012 | Cai et al. |

* cited by examiner

*Primary Examiner* — Quoc Hoang

(57) ABSTRACT

A resistive memory device includes a stack comprising conductor layers and insulator layers, with the edges of the conductor layers and insulating layers exposed on the sides of the stack. An insulator is disposed on a first side of the stack to cover exposed edges of the conductor layers on the first side of the stack. A memory layer disposed over the stack and insulator, such that the memory layer is in electrical contact with edges of the conductor layers on a second side of the stack but is insulated from edges on the first side of the stack by the insulator. A conductive ribbon is disposed over the memory layer to form programmable memory elements where the conductive ribbon crosses edges of the conductor layers on the second side of the stack.

20 Claims, 15 Drawing Sheets

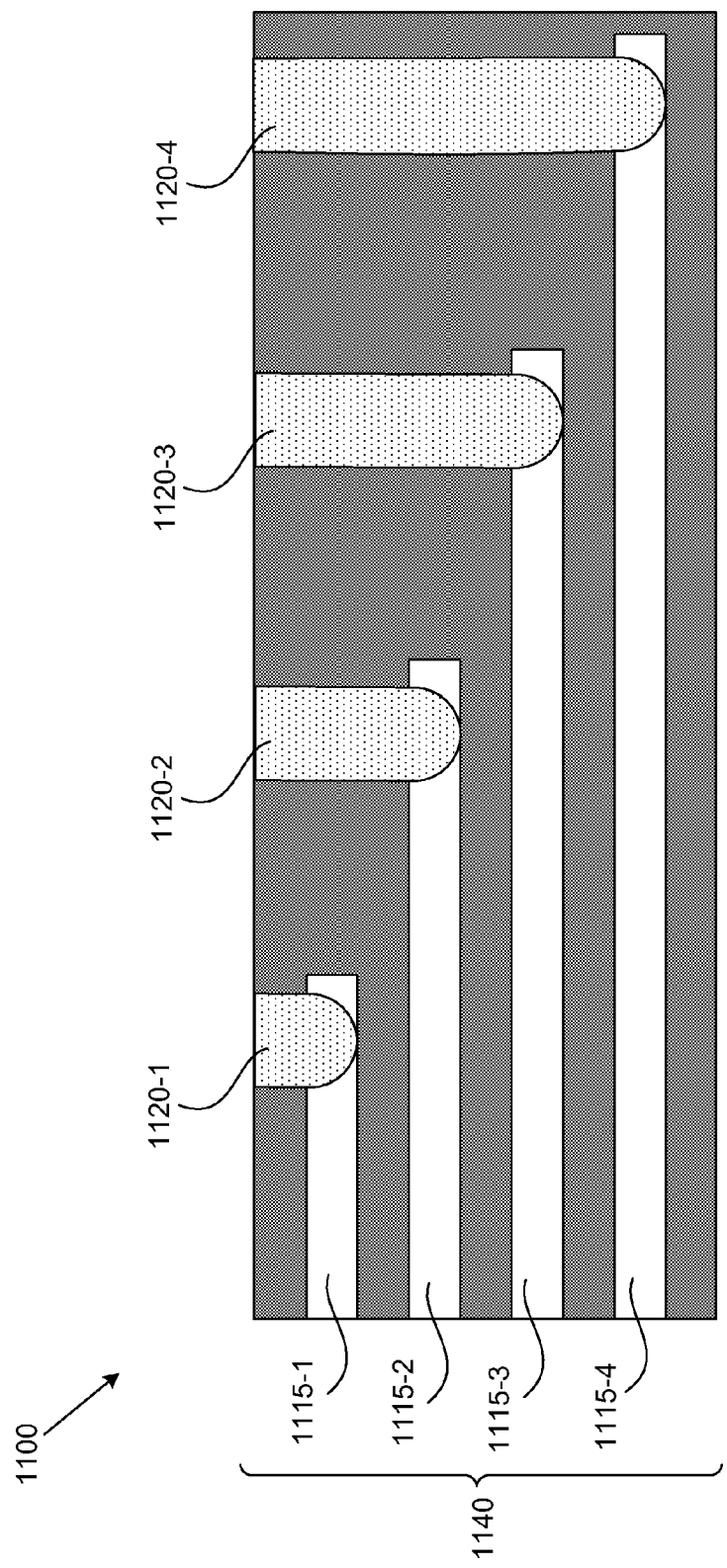

US 8,829,581 B1

RESISTIVE MEMORY DEVICES

BACKGROUND

Resistive memory elements can be programmed to different resistive states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications.

BRIEF DESCRIPTION OF THE DRAWINGS

The accompanying drawings illustrate various examples of the principles described herein and are a part of the specification. The illustrated examples are merely examples and do not limit the scope of the claims.

FIG. 11 shows a via connection technique for making electrical connections to stacked conductors in a stacked resistive memory device, according to one example of principles described herein.

Throughout the drawings, identical reference numbers designate similar, but not necessarily identical, elements.

DETAILED DESCRIPTION

Figure 1:
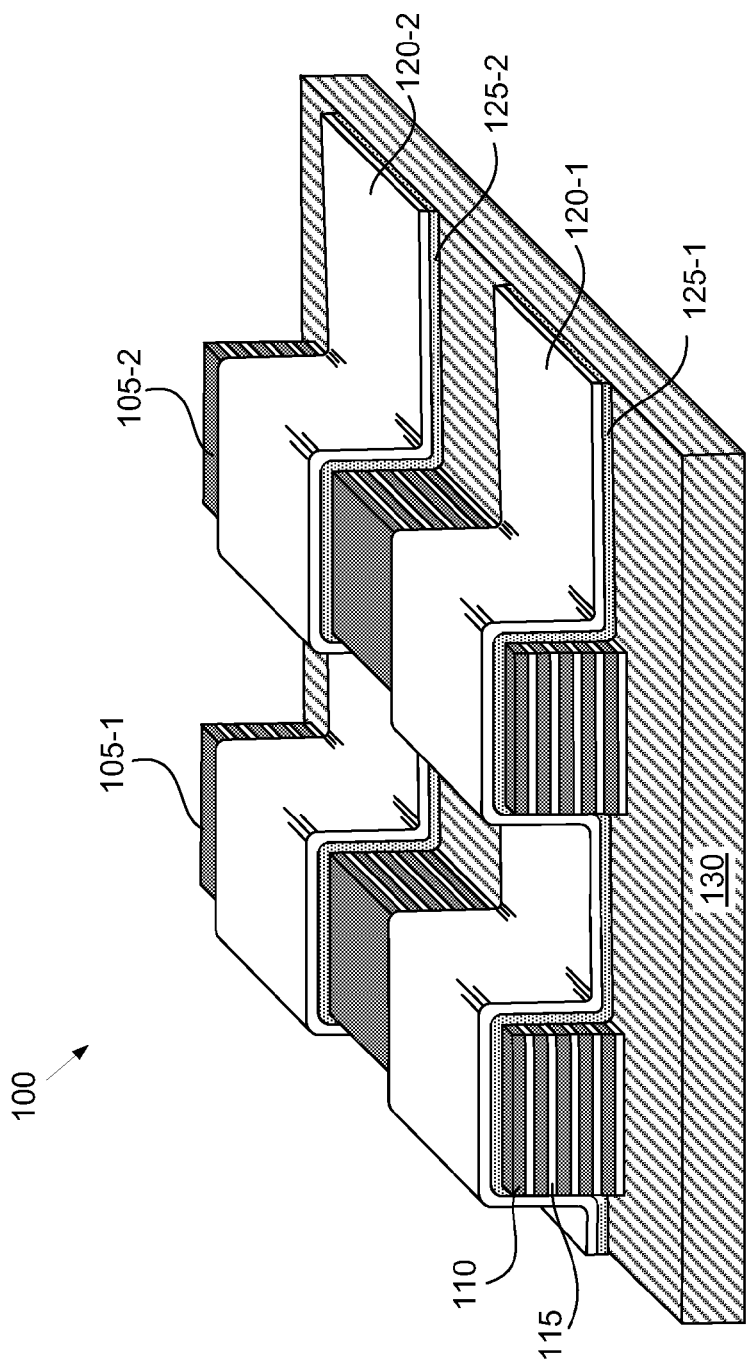
FIG. 1 is a perspective view of a stacked resistive memory device, according to one example of principles described herein.

Resistive memory elements can be used in a variety of applications, including non-volatile solid state memory, programmable logic, signal processing, control systems, pattern recognition, and other applications. In many instances, it is desirable for the number of memory elements in a given area to be maximized while remaining within operational and manufacturing constraints.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples. In general, features shown and/or described in connection with one figure may be combined with features shown and/or described in connection with other figures.

As used in the specification and appended claims, the term "resistive memory elements" refers broadly to programmable nonvolatile resistors such as resistive random access memory (ReRAM), phase change memory, memristor technology based on perovskites (such as $Sr(Zr)TiO_3$), transition metal oxides (such as NiO or $TiO_2$), chalcogenides (such as $Ge_2Sb_2Te_5$ or AgInSbTe), solid-state electrolytes (such as GeS, GeSe, $Cu_2S$), organic charge transfer complexes (such as CuTCNQ), organic donor-acceptor systems, various molecular systems, or other nonvolatile programmable resistive memory elements.

Resistive memory devices may have a variety of configurations and may be incorporated into a range of devices. One such device is a crossbar array. Crossbar arrays generally include a number of conductive column lines and a number of conductive row lines. The column lines cross the row lines to form "crossbar junctions." Resistive memory elements are formed between the column lines and the row lines at the crossbar junctions. In general, the designation of a particular group of conductors as "column lines" or "row lines" is arbitrary.

The resistive memory elements exhibit a non-volatile resistance value (a "state"). In some examples, the resistive memory elements can be used to store data, with the ON or low resistance state representing a digital 1 and an OFF or high resistance state representing a digital 0. In other implementations, the resistive memory elements may be multilevel cells that have more than two readable states.

The resistive memory elements are programmed by applying a programming voltage (or "write voltage") across a memory element. The application of the programming voltage causes a nonvolatile change in the electrical resistance of the memory element, thereby changing its state. The state of the memory element can be read by applying a read voltage. The read voltage has a lower magnitude than the write voltage and does not disturb the state of the resistive memory element. The state can be determined by reading the amount of a current that passes through the resistive memory element when the read voltage is applied. For example, if a relatively large amount of current flows through the resistive memory element, it can be determined that the resistive memory element is in a low resistance state. If a relatively small amount of current flows through the resistive memory element, it can be determined that the memory element is in a high resistance state.

In many implementations, it can be desirable for a resistive memory array to have a high number of memory elements per unit area ("high memory density"). High memory density allows for smaller and potentially less expensive devices to be formed. However, simply miniaturizing the circuit by decreasing the size of the features that make up the circuit can only increase the memory density by a limited amount. At some level of miniaturization, the feature sizes approach fundamental limits of the materials and/or processing method. Further, decreasing the feature sizes close to the manufacturing/material limits can significantly increase the number errors/scraped parts and cost of a memory device. The principles described below provide for a highly dense and scalable memory device that significantly increases the density of the memory elements while maintaining feature sizes that are compatible with the materials and processes. The principles described can result in 4×, 6×, 10× or greater improvement in the density of memory arrays.

FIG. 1 is a perspective view that shows one example of a device (100) that includes a substrate (130), a plurality of stacks (105), resistive memory layers (125) and an upper conductor ribbon (120) that overlays the memory layers (125). In this example, the stacks (105) include a number of alternating conducting layers (115) and insulating layers (110). In one implementation, the stacks (105) are long parallel structures that have widths that are at or greater than the minimum feature size for the manufacturing processes used to form the device. For example, current lithography and nanoimprint techniques may have minimum feature sizes that are on the order of 10 nanometers. Thus, if the stacks were formed using a nanoimprint technique with a minimum feature size of 10 nanometers, the stacks would have a width of 10 nanometers or more. Nanoimprinting is a method for fabricating nanometer scale patterns that is low cost, high throughput and high resolution. It creates patterns by mechanical deformation of the imprint resist. The imprint resist is typically a polymer formulation that cured by heat or UV light during the imprinting.

In some processes, the thickness of the layers (110, 115) in the stack (105) can be much more tightly controlled than the width of the stack (105). For example, atomic layer deposition techniques can be used to deposit layers with thicknesses controlled to the atomic level (angstroms). For example, a conductive layer (115) in the stack (105) may be 10 nanometers wide and only 1 nanometer in thickness. In some situations, it may be desirable for the conductor layers (115) to be significantly thicker and/or wider. For example, by increasing the thickness of the conductive layers (115), their electrical resistance can be significantly reduced. Reducing the electrical resistance of the conductors can be helpful in reducing Ohmic heating and allowing larger switching currents to be used. The area density of the memory is not adversely affected by having thicker conductive layers (115). The conductive layers (115) may be formed from any suitable material, including conductive metals such as platinum, conductive polymers, conductive carbon based materials (such as diamond film, graphene, carbon nanotubes), or other suitable materials.

The insulating layers (110) can also be formed from a variety of materials and have a variety of widths and thicknesses. For example, the insulating layer (110) may be formed from silicon oxide or other suitable insulating material. Increasing the thickness of the insulating layers (110) may improve the operational characteristics and robustness of the device. Thicker insulating layers (110) increase the separation of the conductive layers (115), reducing capacitive cross talk between them. Further, thicker insulating layers (110) provide increased thermal mass and heat dissipation characteristics. However, increasing the thickness of the insulating layers (110) increases the amount of material used and may increase the process time used to create the memory device.

The stacks (105) described above are only examples. The stacks (105) could have a variety of other configurations. For example, the stacks (105) may not have a rectangular cross section or an elongated shape. The stacks (105) may expose the conductor layers (115) in a variety of ways. In the examples above only the edges of the conductor layers (115) are exposed. However, other portions of the conductor layers (115) in the stack (105) may be exposed. For example, portions of the top of the conductor layers (115) could be exposed.

A resistive memory layer (125) is deposited over the stacks (105). In this example, the resistive memory layer (125) is a stripe that perpendicularly crosses the stacks (105). However, the resistive memory layer (125) could have a variety of shapes/sizes and intersection geometries. The resistive memory layer (125) could be formed from a variety of materials including transition metal oxides, perovskites, and other materials discussed above. In this example, the resistive memory layer (125) is deposited over and is in direct electrical contact with the exposed edges of the conductor layers (115) on the side of the stack (105). As deposited, the resistive memory layer (125) is in a high resistance or insulating state. Portions of the resistive memory layer (125) that are exposed to appropriate voltages/currents can then change to a conductive state.

An upper conductive layer is deposited over the resistive memory layer (125) and segmented to form a number of parallel upper conductor ribbons (120). The upper conductor ribbons (120) are in direct electrical contact with the resistive memory layer (125). In this implementation, the conductors (115) in the stack (105) form the column lines and the upper conductor ribbons (120) form the row lines. The crossbar junctions are formed where the upper conductor ribbons (120) cross the edges of the conductors (115) in the stack (105). Portions of the resistive memory layer (125) that are sandwiched between edges of the conductor layers (115) and the upper conductor ribbons (120) can be used as a memory element or a switch. For example, a programming voltage could be applied across a selected conductor (115) in the stack (105) and a selected upper conductor ribbon (120). The portion of the resistive memory layer (the memory element) disposed at the intersection of the two selected conductors (115, 120) can then be programmed to a desired low or high resistance state or some other intermediate resistance state. The state of the memory element can then be used to represent digital/analog data or be used as a programmable switch between the two conductors (115, 120).

By using the edge of the conductors (115) in the stack (105) and the crossing upper electrode ribbon (120) to define the size of the memory element, the memory element can be constructed with variable size. The size of the memory element is dependent on the thickness of the conductors (115) in the stack and the width of the upper conductor (120). Because the thickness of the conductors (115) in the stack can be controlled very precisely (at angstrom resolution) resistive memory elements can be formed with significantly smaller cross sectional areas than would be conventionally formed using crossbar devices that place a resistive memory element between an upper surface of a column crossbar and a lower surface of a row crossbar. These memory elements have a minimum area that is defined by the square of the minimum feature size. In contrast, the memory elements described above have an area that is the product of the minimum feature size times the minimum thickness of a conductive film. For example, in a crossbar array with a minimum feature size of 10 nanometers, the smallest area of a memory element sandwiched between an upper surface of a row line and a lower surface of a column line is 100 nanometers square. In contrast, for the same minimum feature size (10 nanometers) and a layer thickness of 10 angstroms (1 nanometer), the area of the memory element formed between an edge of a row line and a column line would be 10 nanometers square. Shrinking the size of the memory element may provide a number of advantages, including decreased variability between memory devices, denser packing, quicker switching times, and other advantages. If memory elements are desired with larger areas, the thickness of the conductors (115) in the stack ("stack conductors") could be increased and/or the width of the upper conductor ribbons (120) could be increased.

Figure 2:
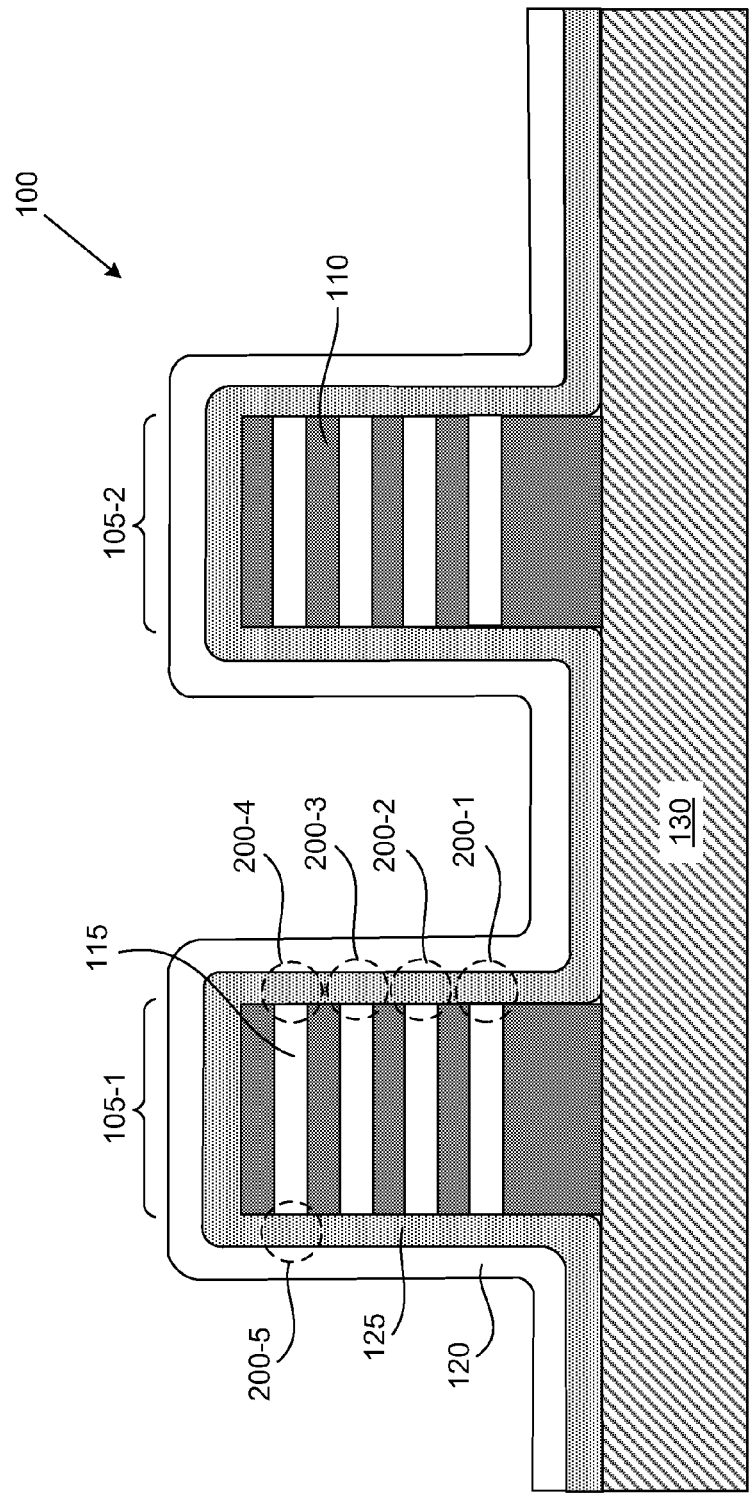
FIG. 2 is a side cross-sectional view showing the structure within a stacked resistive memory device, according to one example of principles described herein.

The geometry shown in FIG. 2 is a cross sectional diagram of the resistive memory device. As shown in FIG. 2, the intersection between edges of the stack conductors (115) and the upper conductor ribbons (120) creates stacked memory elements (200-1, 200-2, 200-3, 200-4) along the edge of the stack (105). This significantly increases the density of the memory because, in this example, the four memory elements (200-1, 200-2, 200-3, 200-4) can be located within the same area as one conventionally constructed crossbar memory element.

FIG. 2 is a cross-sectional view showing the structure within a stacked resistive memory device (100). As discussed above the structure includes a substrate (130), stacks (105) formed over the substrate, and a memory layer (125) and conductor ribbon (120) formed over the stacks and substrate. The stacks include stack conductors (115) and insulating layers (110). FIG. 2 also illustrates that there are memory elements (200) created on both edges of a given stack conductor (115). Only a portion of the memory elements are labeled. In effect, two memory elements (200-4, 200-5) on either side of the stack conductor (115) are combined to act as a single programmable switch between the stack conductor (115) and the upper conductor (120). This may produce some advantages, such as increased robustness and lifetime of the memory elements. For example, if a memory element (200-5) on the left edge of a stack conductor (115) has a slightly lower switching voltage than the memory element on the right hand edge (200-4) of the stack conductor (115), the left memory element (200-5) will sustain most of the wear associated with programming. When a programming pulse is applied across the stack conductor (115) and the upper conductor (120), the left memory element (200-5) will switch first. When the left memory element (200-5) switches to a low resistance state, the programming voltage may drop and current may be directed through the left memory element. This may prevent switching of the right memory element (200-4). Consequently, the left memory element (200-5) may wear out significantly faster than the right memory element (200-4). If the left memory element (200-5) eventually fails due to wear from the number of switching cycles, the right memory element (200-4) can step in to maintain the functionality of the device. With the left memory element (200-5) nonfunctioning (in a high resistance state) the right memory element (200-4) will be exposed to the full programming voltage and will switch as desired. Thus the lifetime of the device may be improved because the left and right memory elements are redundant.

However, there may be a number of considerations related to having both left and right memory elements (200-5, 200-4) associated with a single stack conductor (115). Having two memory elements associated with the same stack conductor may introduce increased switching variability (i.e. there may be larger differences in ON resistances and/or OFF resistances between different stack conductors). For example, a left memory element (200-5) may switch completely to a desired resistance state while a right memory element may only partially switch to the desired resistance state (200-4). This can result in less clarity in the state of the devices.

In some embodiments, the left and right memory elements may be intentionally constructed with different characteristics. For example, a first programming voltage may be used to switch a left memory element (200-5) and a second higher programming voltage may be required to switch the right memory element (200-4). The first programming voltage is not sufficient to substantially alter the state of the right memory element (200-4). This effectively creates a multistate connection between each stack conductor (115) and the upper conductor ribbons (120) that intersect it. For example, in a first state both the left memory element (200-5) and the right memory element (200-4) are in a low resistance state. In a second state, the left memory element is a high resistance state and the right memory element is still in a low resistance state. In a third state, both memory elements are in the high resistance state. For example, the first state may have a resistance of 10,000 Ohms, the second state may have a resistance of 100,000 Ohms, and the third state may have a resistance of 1,000,000 Ohm. These different resistances allow each state to be distinguished from the other states and for the states to represent different values, similar to multi-level cell (MLC) memory. The differences in the behavior and resistance of the left memory elements and right memory elements can be accomplished in a variety of ways, including varying the material type, dopant type, thickness, and/or dopant density.

Figure 3A:
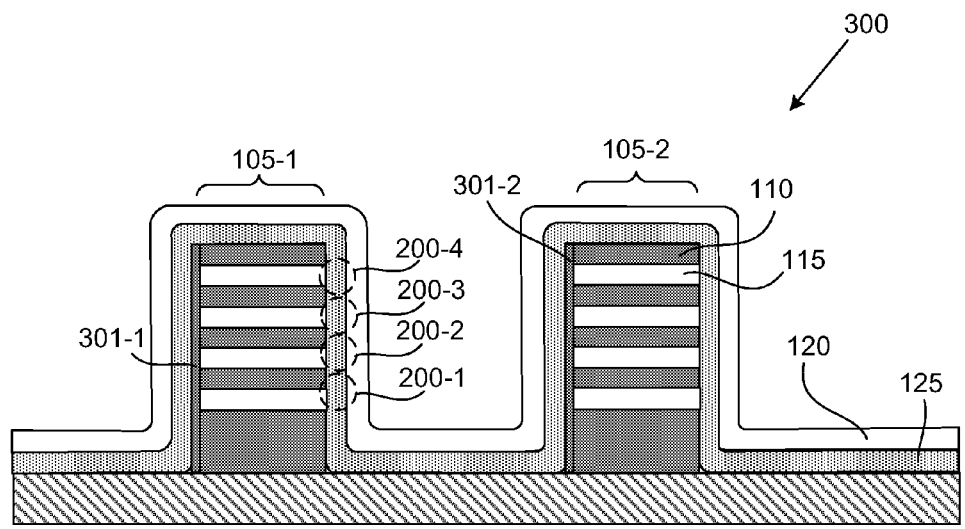
FIGS. 3A-3E are various side cross-sectional views showing the structure within a stacked resistive memory device, according to one example of principles described herein.

FIG. 3A shows a resistive memory device (300) that includes stacks (105) made up of alternating conductors and insulating layers (110, 115). In this example, memory elements (200) are formed on only one side of the stacks (105). This simplifies the behavior of the device because there are not two memory elements connected to the same stack conductor. In this example, an insulator (301) is disposed over one side of each stack (105) before the deposition of the resistive memory layer (125) and the upper conductor ribbon (120). The insulator (301) may be deposited in a number of ways, including shadow deposition. In shadow deposition, the insulating material is directionally applied to the structure. The direction is selected so that one or more features "shadow" other features from the deposition. In this example, the deposition angle is selected so that the insulating material is deposited only on the left side of each stack (105). The right sides of the stacks (105) are shadowed by the body of the stacks (105).

Figure 3B:
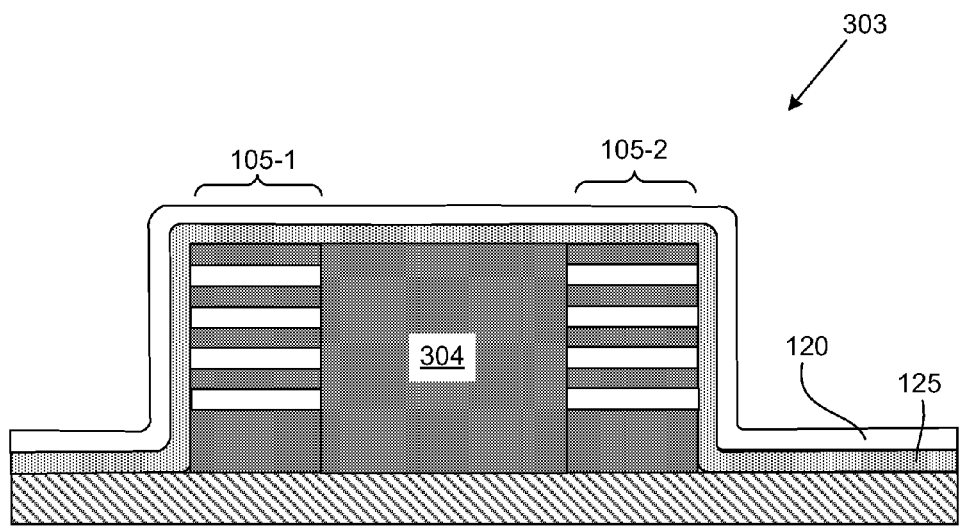

The implementation described above is only one example of a stack (105) with one side insulated. A variety of other implementations could be used. For example, FIG. 3B shows an implementation (303) where every other gap between the stacks (105) could be filled with insulating material (304). In this configuration, the resistive memory layer (125) and upper conductor ribbon (120) pass up the left side of a first stack (105-1), across the top of the first stack, over the insulator material (304) filling the gap, over the top of the second stack (105-2) and then down the right side of the second stack. This forms memory elements on the left side of the first stack (105-1) and on the right side of the adjacent second stack (105-2). This allows two columns per crossbar junction, further increasing the memory density.

Figure 3C:
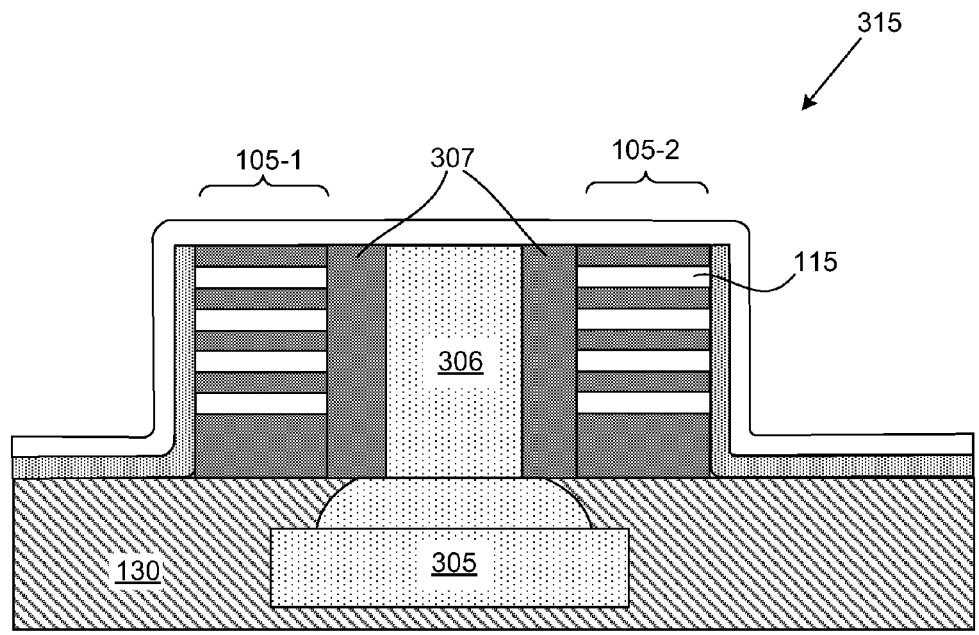

FIG. 3C shows a stacked resistive memory device (315) where the stacks (105) and upper conductor ribbons (120) are formed over area distributed circuitry (305) in the substrate (130). The circuitry is connected to the upper connector ribbons (120) by vias (306) that pass upward between the stacks (105). In this example, the vias (306) are insulated from the conductors (115) in the stacks by insulating material (307). The use of area distributed circuitry (305) that is beneath the memory layers can significantly reduce the footprint of the device compared to access circuitry that is distributed around the perimeter of the memory.

Thus, in one example, a resistive memory device includes a stack comprising conductor layers and insulator layers, with the edges of the conductor layers and insulating layers exposed on the sides of the stack. An insulator is disposed on a first side of the stack to cover exposed edges of the conductor layers on the first side of the stack. The insulator may be a shadow masked layer as discussed in FIG. 3A, a block of insulating material that fills a gap between stacks as discussed in FIG. 3B or other geometry (see e.g. FIG. 3C, FIG. 3E). A memory layer disposed over the stack and insulator, such that the memory layer is in electrical contact with edges of the conductor layers on a second side of the stack but is insulated from edges on the first side of the stack by the insulator. The memory layer may include one or more sublayers as discussed below (see e.g. FIG. 8). A conductive ribbon is disposed over the memory layer to form programmable memory elements where the conductive ribbon crosses edges of the conductor layers on the second side of the stack. These programmable memory elements switchably connect the conductor layers in the stack(s) with the conductive ribbon.

Figure 3D:
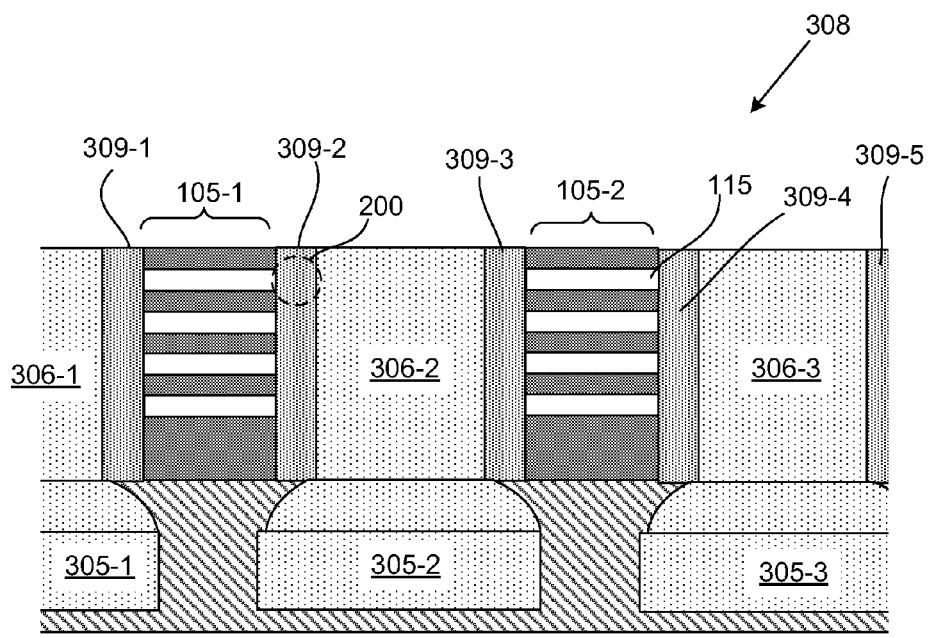

FIG. 3D shows a memory device (308) where vias (306) from area distributed circuitry (305) directly interact with the stacks (105) to form memory elements (200). Resistive memory material (309) is interposed between the sides of the stacks (105) and the vias (306). The vias (306) can have a variety of shapes and sizes. Each configuration may have advantages. For example, if the vias (306) are circular, the area of memory elements (200) can be very small. This can increase the repeatability of the performance of the memory elements (200) within the device (308). Further, if the portion of the memory layer (309) that performs resistive switching between a particular conductor (115) and the via (306) (typically at the closest approach of the circular via to the planar side of the stack) becomes worn out and no longer functions, there are a variety of slightly longer paths between the via (306) and the edge of the conductor (115) that will automatically begin to form resistive switching bridges. The switching of these longer paths may require slightly higher programming voltages and/or programming time. These higher programming voltages/longer programming times can be used to measure the graceful degradation of the memory elements/memory layer. Alternatively, the vias (306) may be square, rectangular, or some other shape. The example shown in FIG. 3D with vias used instead of conductive ribbons may have a number of advantages, including lower capacitance values and lower cross talk between memory elements.

Figure 3E:
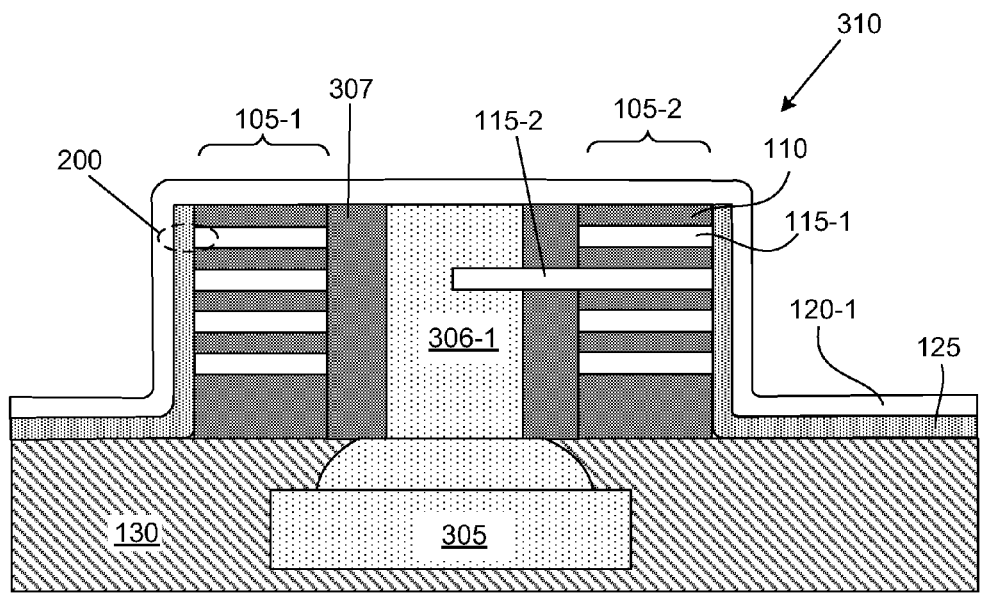
Figure 3F:
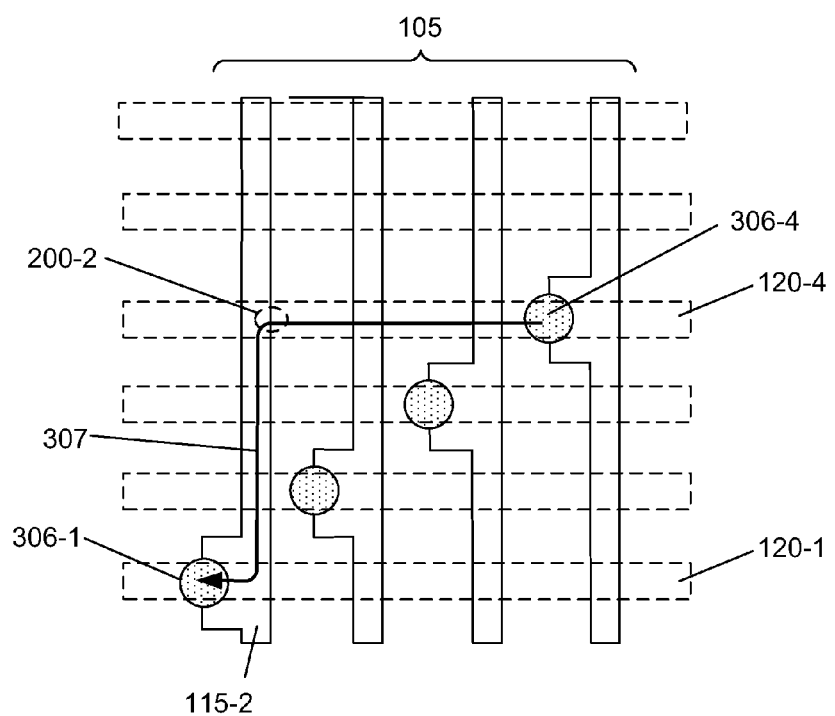
FIG. 3F is a top view of a stacked resistive memory device that uses area distributed vias to connect to conductors in the array, according to one example of principles described herein.

FIG. 3E shows a stacked resistive memory device (310) where a via (306) from area distributed circuitry (305) directly connects to both a stack conductor (115-2) and an upper conductor ribbon (120). The vias (306) are distributed over the substrate (130) surface as shown in FIG. 3F. FIG. 3F is a planar cross section through a stack conductor layer in the stacked resistive memory device (310). As shown in FIGS. 3E and 3F, each upper connector ribbon/stack conductor (e.g.115-2, 120-1) pair is connected to one via (e.g. 306-1). The top of the via (306-1) connects to the upper conductor ribbon (120-1) and a stack conductor (115-2) that extends into the gap between stacks (105) to make electrical contact with the via (306-1). This configuration significantly reduces the number of vias (306) required to address the memory elements (200). The number of memory elements (200) is slightly reduced because of the electrical connections between the upper conductor and stack conductor pairs (120, 115). The area distributed circuitry can be formed in complementary metal oxide semiconductor (CMOS) layers in the substrate (130) and can be spaced to across the memory area. Insulating material (307) is interposed between the sides of the stacks (115) and the vias (306). In this example, the upper conductor ribbon can be thought of as an extension of the stack conductor and each stack conductor will interact with every other stack conductor to address a memory element. This completely populates the address space (except the diagonal), with every stack conductor connecting by a memory element to every other stack conductor. In some examples, this architecture may form redundant memristive connections, with two given vias being switchable connected by two memory devices. This will produce substantially the same results discussed above with respect to creating a multiple states and extending the lifetime of device.

FIG. 3F shows a current path (307) that passes through memory element (200-2) when it is addressed by vias 306-1 and 306-4. The current passes from 306-4, across ribbon via 120-4, through the memory element 200-2, and down the stack conductor (115-2) and to the via 306-1.

Figure 4:
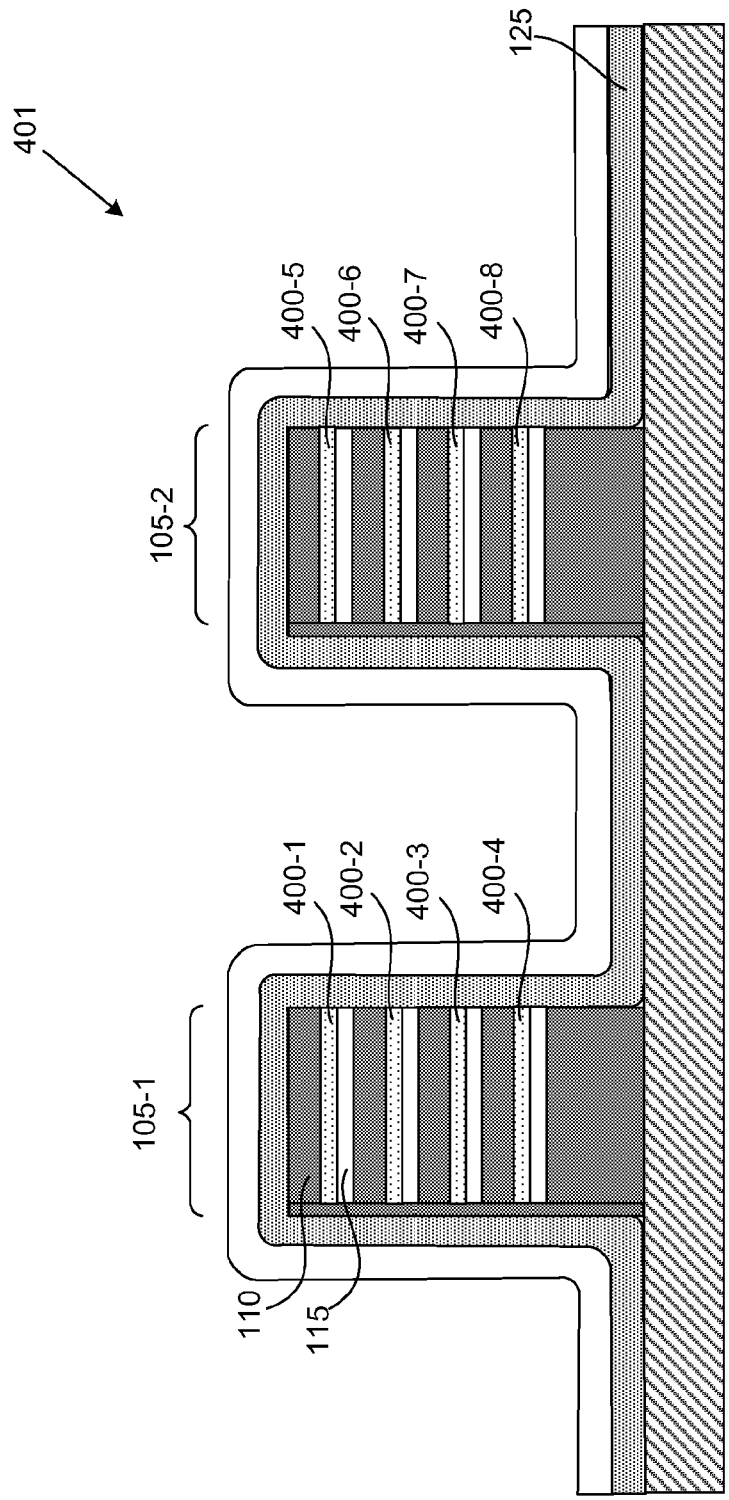
FIG. 4 is a side cross-sectional view showing the structure within a stacked resistive memory device, according to one example of principles described herein.

FIG. 4 shows a stacked resistive memory device (401) where additional layers (400-1, 400-2, 400-3, 400-4, 400-5, 400-6, 400-7, 400-8) are added to the stacks (105). These additional layers may include sources for mobile dopants in the resistive memory layer (125). Achieving precise doping of the resistive memory layer (125) can be challenging. If too few dopants are included in the resistive memory layer (125), the resulting memory element will have a very high resistance in the ON state. If too many dopants are included, the resulting memory element will have a very low resistance in both the ON and OFF states. However, by including dopant rich layers with the stack conductor layers (115), the dopants can migrate from the dopant rich layers into portions of the resistive memory layer (125) that are in proximity to the edge of the stack conductor (115). This may result in a non-uniform distribution of dopants throughout the resistive memory layer (125), with higher concentrations of dopants near the edges of the stack conductors (115) and lower concentrations in the gaps between the stack conductors (115). This not only allows for a precise injection of dopants into the resistive memory layer (125), but also may prevent undesirable conduction through the resistive memory layer (125) between adjacent stack conductors (115).

This method of injecting dopants into the resistant memory layer (125) can be very precise because the composition of the dopant rich layer can be precisely controlled and the contact area between the dopant rich layer and the resistive memory area can be precisely formed. This contact area is determined by the thickness of the dopant rich layer and the width of the dopant rich layer. For example, the conductor may be a platinum layer that is 10 nanometers in thickness and the dopant rich layer may be tantalum oxide layer (TaOx) with a thickness of 2 nanometers. However, any combination of a conductor and a non-stoichiometric vacancy rich layer may be used.

Figure 5:
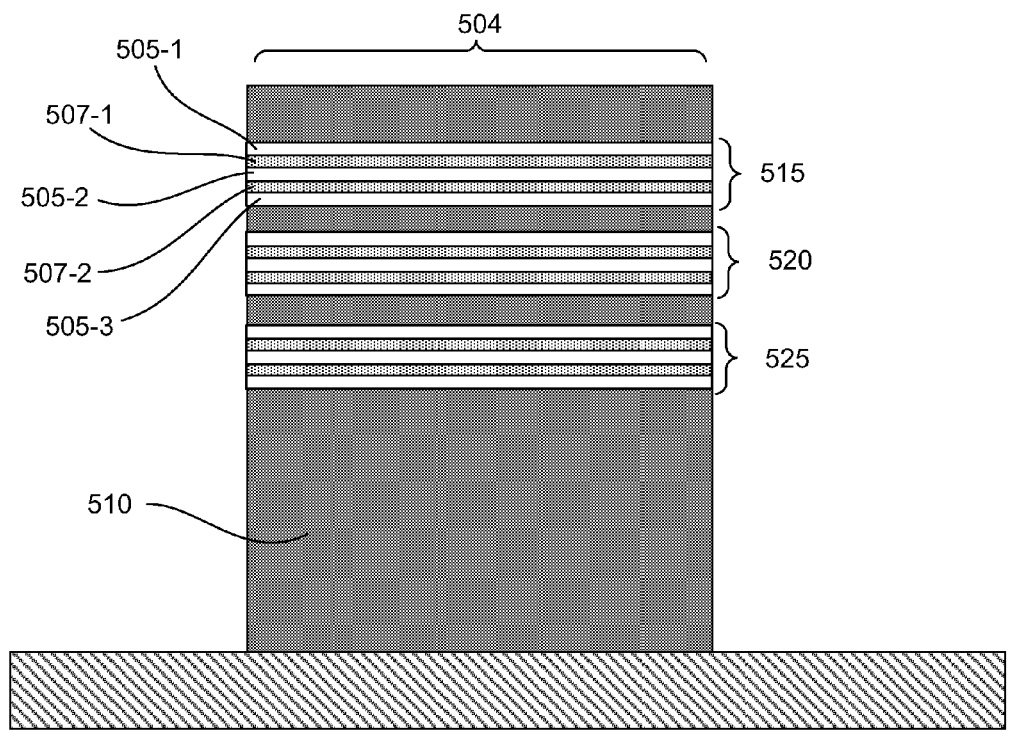
FIG. 5 is a side cross-sectional view showing a stack of programmable resistive layers extending through an insulator, according to one example of principles described herein.
Figure 6:
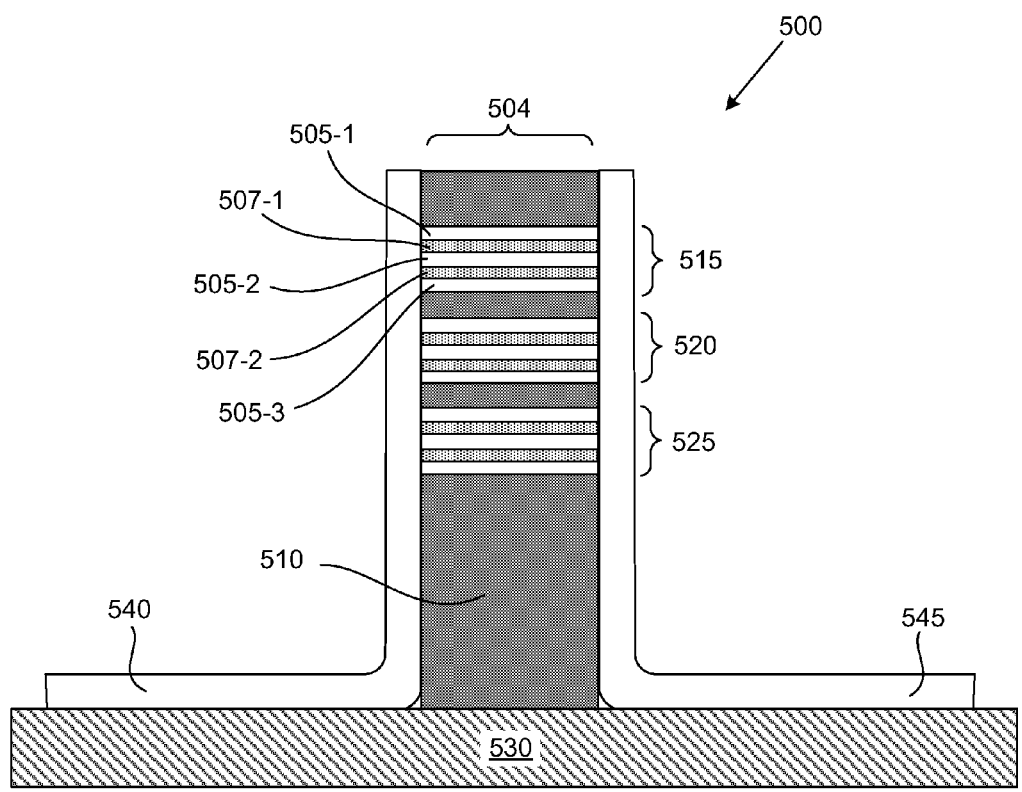
FIG. 6 is a side cross-sectional view of a stacked resistive memory device, according to one example of principles described herein.

FIGS. 5 and 6 show an alternative resistive memory device where various memory elements (515, 520, 525) are disposed in a central body (504). The memory elements are separated by insulating material (510). Two separate electrodes (540, 545 FIG. 6) electrically contact the left and right edges of the resistive memory elements (515, 520, 525). The resistive memory elements (515, 520, 525) may be a single layer or may have multiple sublayers. In the example shown in FIGS. 5 and 6, the resistive memory elements have multiple sublayers. These sublayers may have a variety of functions and compositions. In this example, the sublayers include one or more resistive memory layers (507-1, 507-2) and one or more dopant reservoir layers (505-1, 505-2, 505-3). As discussed above, dopants from the dopant reservoir sublayers may migrate into the resistive memory sublayers. FIG. 6 shows the resistive memory device (500) with a left electrode (540) connected to the left side of the resistive memory layers (515, 520, 525) and a right electrode (545) connected to the right side of the resistive memory layers. In this example, there are three different resistive memory layers connected in parallel between the left electrode (540) and the right electrode (545). These resistive memory layers (505) may have the same or different characteristics. The resistive memory layers (505) may provide redundancy to extend the lifetime of the device or may be used together to provide different states to create a multi level memory cell.

Thus, a resistive memory device may include a stack comprising a memory layer, in which edges of the memory layer are exposed on the sides of the stack. A first electrode is in electrical and mechanical contact with the edges of memory layers exposed on a first side of the stack. A second electrode is in electrical and mechanical contact with the edges of memory layers exposed on a second side of the stack such that the memory layer forms a programmable resistive switch connecting the first electrode and second electrode. In the examples illustrated above, the stack comprises multiple memory layers separated by insulating layers and the multiple memory layers form parallel programmable resistive switches between the first electrode and second electrode.

Figure 7:
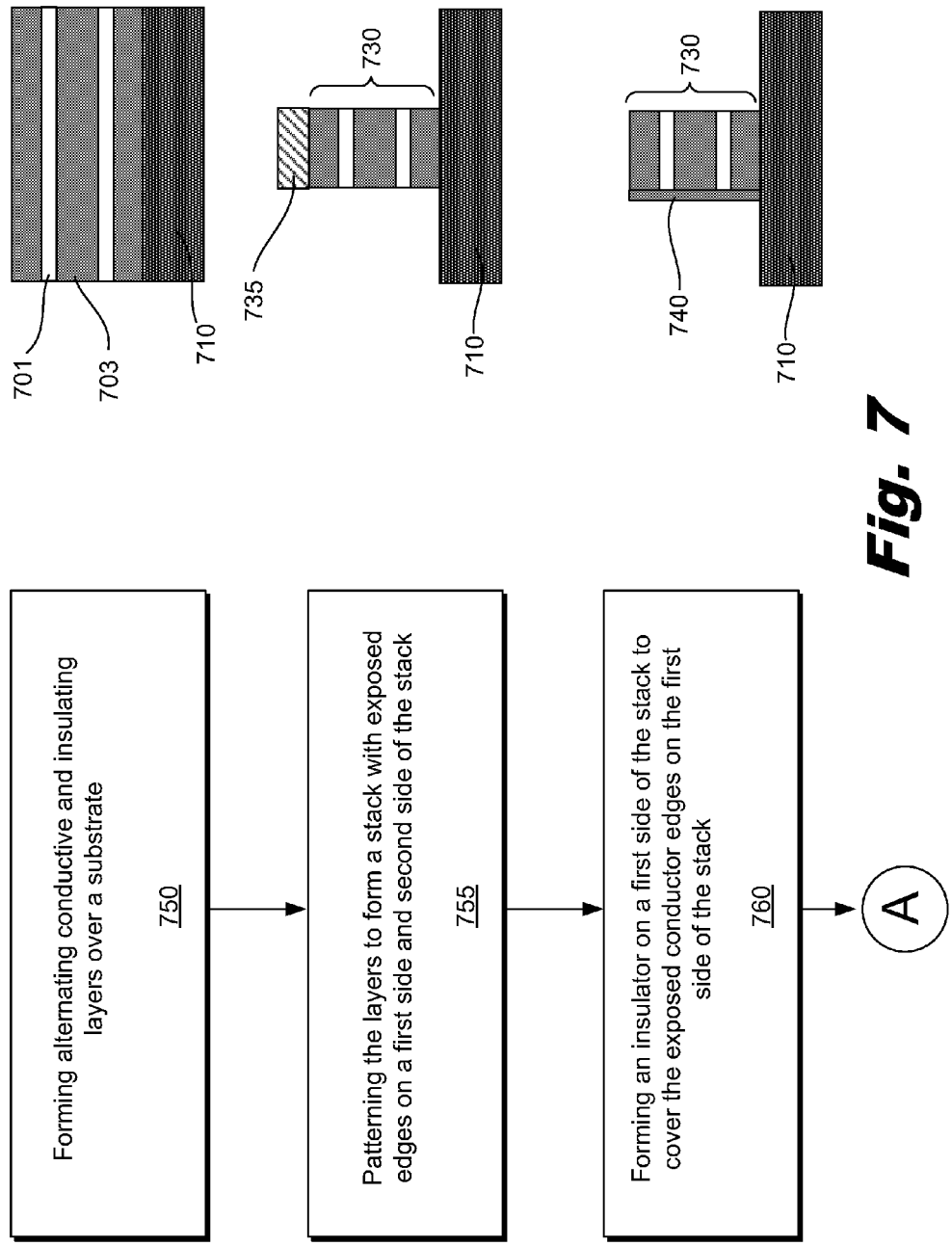
FIG. 7 is a flowchart with accompanying diagrams of one method for constructing a stacked resistive memory device, according to one example of principles described herein.
Figure 7:
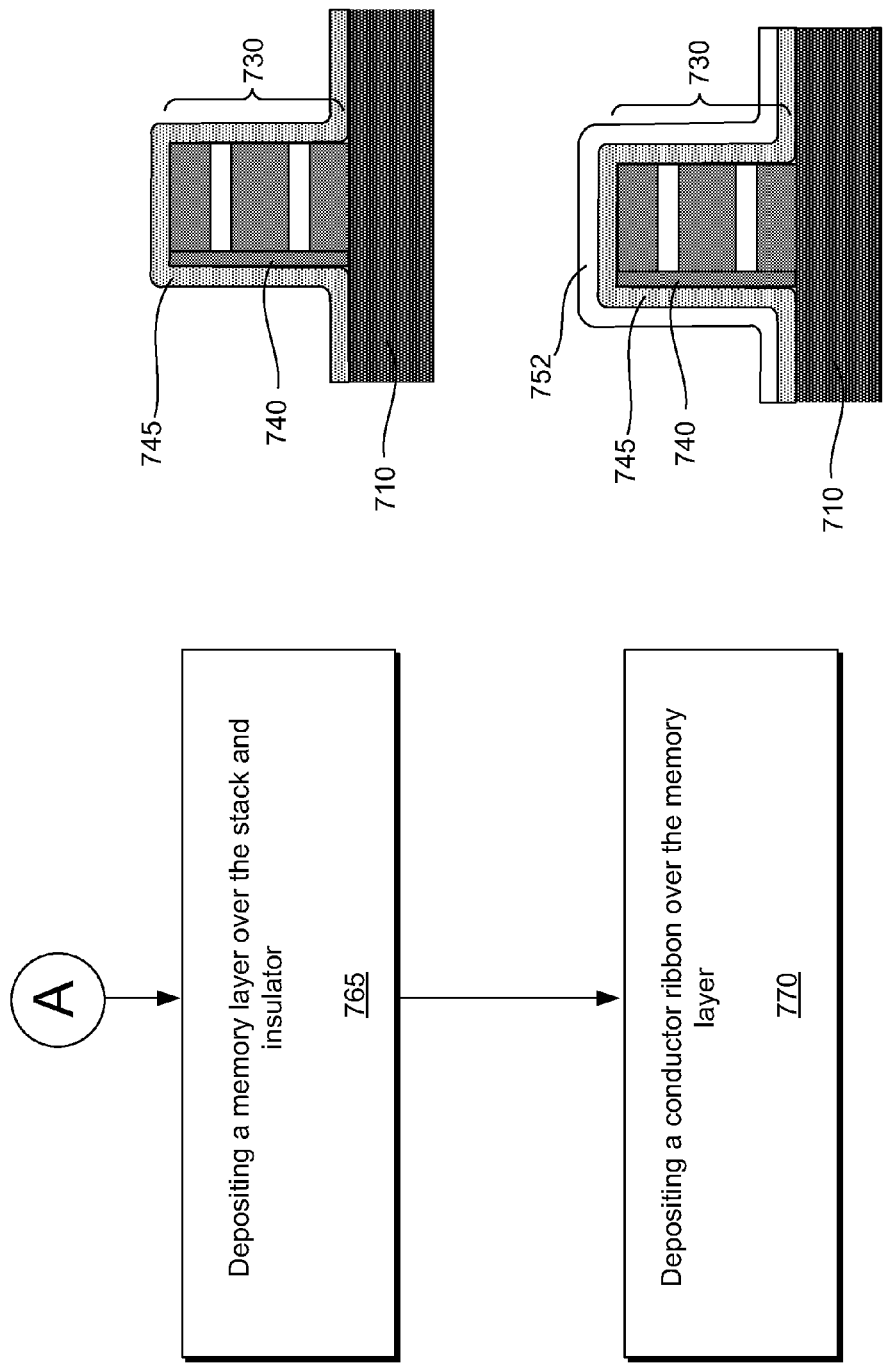

FIG. 7 is a flowchart of one example of method that could be used to create a stacked resistive memory device. A number of layers, including alternating conductive (701) and insulating (703) layers are formed over a substrate (710) (block 750). A variety of other layer types can be substituted or added. These layers are then patterned using any of a number of techniques to form stacks (730). For example, the layers may be patterned to form a stack with exposed edges of the conductor layers on a first side and second side of the stack (block 755). The patterning process may include, for example, depositing photoresist over the layers, curing portions of the photoresist, removing uncured portions of the photoresist and then etching away portions of the layer that are not covered by cured photoresist (735). This or any other appropriate subtractive technique can be used to form the stacks (730). In the figure associated with block 755, the cured photoresist (735) is shown over the remaining portion of the layers (the "stack") (730). In this implementation, an insulator (740) is formed on a first side of the stack to cover the exposed edges on the first side of the stack (block 760). The memory layer (745) is then deposited over the stack (730) (block 765). The upper conductive ribbon (752) is then disposed over the resistive memory layer (745) (block 770).

The method described above is only one example. A variety of other methods and techniques could be used. The blocks described may be reordered, combined, eliminated and new blocks can be added.

Figure 8:
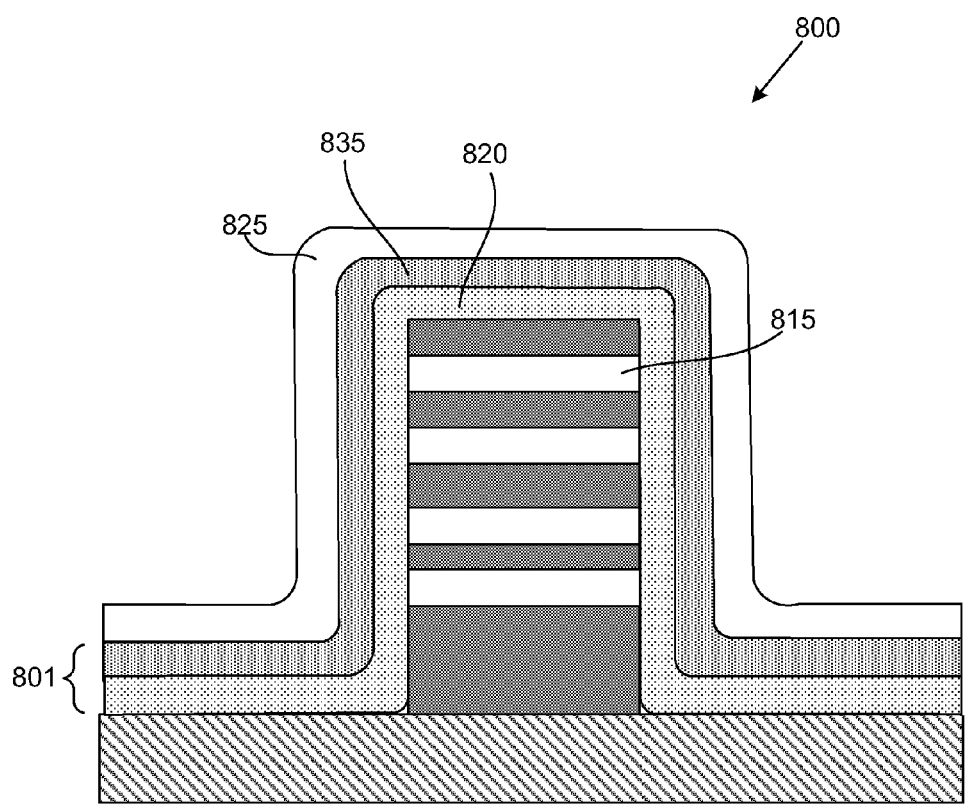
FIG. 8 is a cross sectional diagram of a stacked resistive memory device, according to one example of principles described herein.

FIG. 8 shows an alternative example of a resistive memory device (800), where the resistive memory layer (801) includes two different sublayers (835, 820). In one implementation, the sublayers (835, 820) may include a highly doped layer (835) and a lightly doped layer (820). The highly doped layer (835) may be conductive while the lightly doped layer (820) may be nonconductive. When a switching voltage is applied between the upper conductor (825) and one or more of the stack conductors (815), dopants from the highly doped layer (835) migrate into the lightly doped layer (820) to form a conductive pathway between the upper conductor (825) and the stack conductor (815). When a reverse switching voltage is applied, the mobile dopants may migrate back into the heavily doped layer (835), leaving the lightly doped layer (820) in an insulating state. This dramatically increases the electrical resistance between the upper conductor (825) and the stack conductor (815). As discussed above, the position of the mobile dopants is not substantially changed by reading voltages that are applied to determine the state of the memory element.

In other examples, the additional sublayers (835, 820) may be formed in the resistive memory layer (801) to reduce leakage currents through a memory element when the memory element is not selected for reading or programming. For example, the resistive memory layer (801) may contain sublayers (835, 820) that create Schottky barriers or other diode like behavior that blocks lower voltages but break down when higher voltages are applied. In other examples, the diode behavior between the sublayers (835, 820) may only allow current to flow in a single direction through the resistive memory layer (801).

In some examples, the sublayers (835, 820) may form both a nonvoltaile switch that forms the memory portion of the memory element and a volatile switch that switches from a very high resistance state to a low resistance state when a reading or programming voltage is applied. However, the volatile switch remains in its high resistance state when lower voltages are applied. These lower voltages include "half select voltages" where one of the conductors is carrying a voltage but the other conductor connected to the memory element is not. This means that this particular memory element is not targeted for reading or writing at that time. The volatile switch prevents undesired electrical current from passing through the device in the half select case.

The resistive memory layer (801) described above may use mobile dopants for switching. A variety of other technologies and approaches could be used in the resistive memory layer. For example, the resistive memory layer may include a phase change material that alters its conductivity in a nonvolatile manner.

Figure 9A:
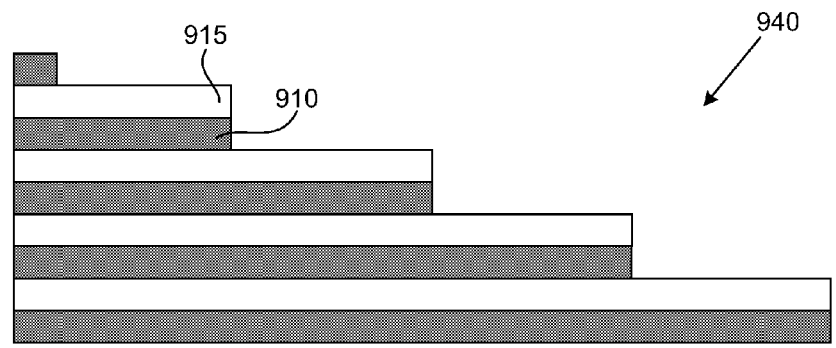
FIGS. 9A and 9B show one connection technique for making electrical connections to stacked conductors in a stacked resistive memory device, according to one example of principles described herein.
Figure 9B:
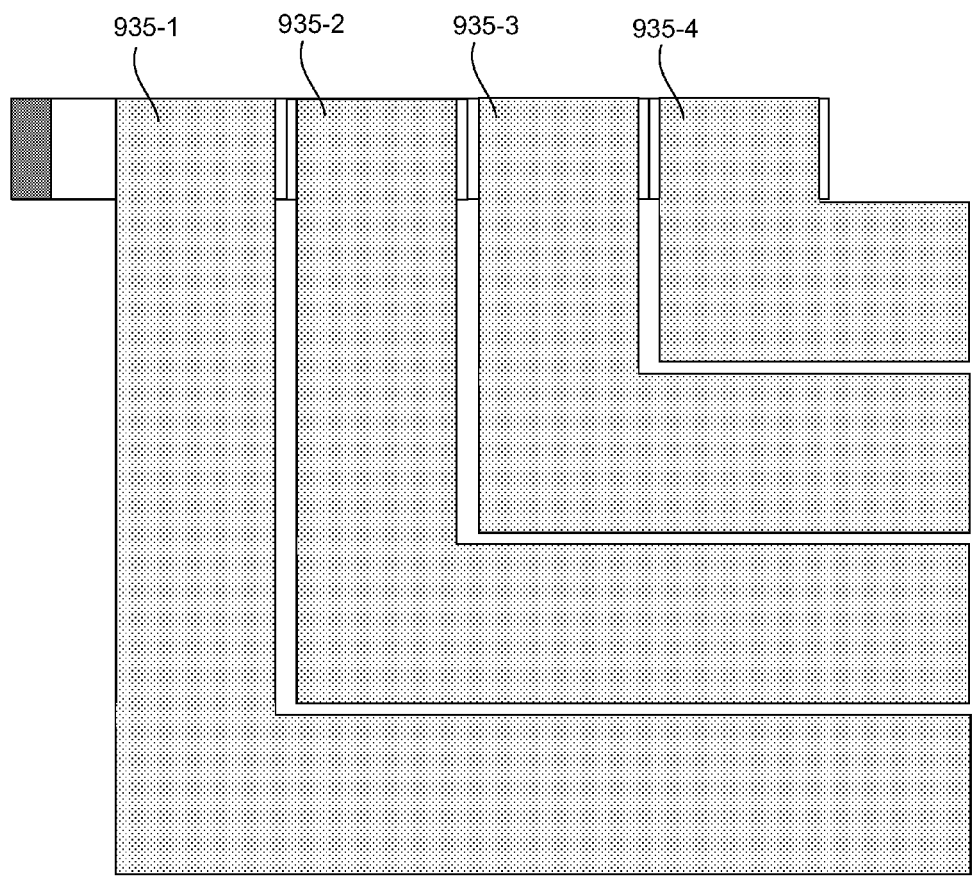
Figure 10:
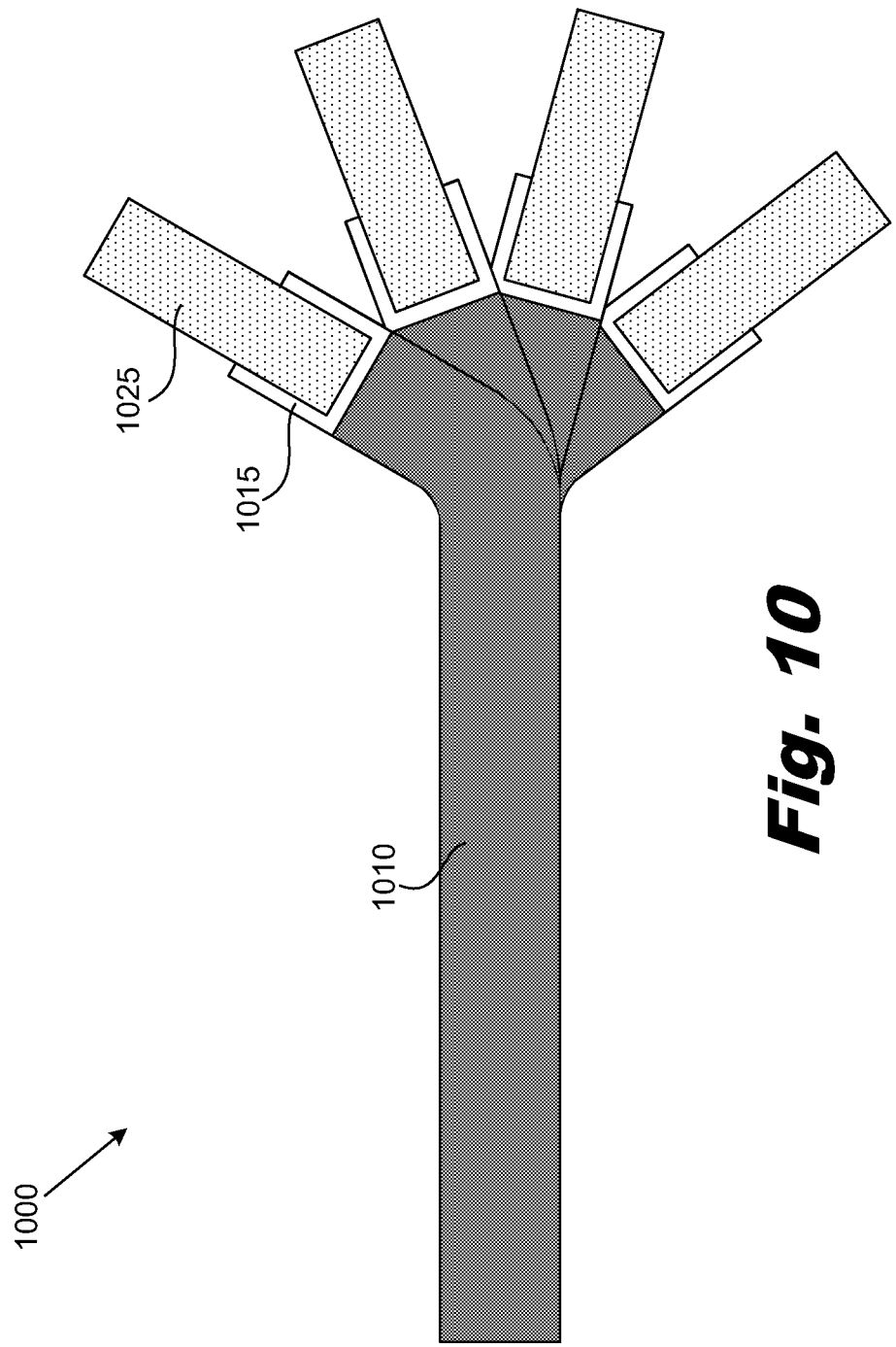
FIG. 10 shows a fan out connection technique for making electrical connections to stacked conductors in a stacked resistive memory device, according to one example of principles described herein.

FIGS. 9-11 show various geometries and methods for making connections to the conductors (915) in the stack (940). In general, the geometries create exposed attachment points on each of the conductors (915) so that an electrical connection can be made with each of the conductors (915). In FIG. 9A, the end of the stack (940) has a stair step profile that progressively exposes the ends of the various conductors (915) so that traces (935) can be connected to them. The connection of the traces (935) to exposed portions of the conductors (915) is shown in FIG. 9B. These electrical connections may be made at any point along the stack (940), including a first end, an opposite end, a middle, or another location along the stack (940). In some situations it may be desirable to connect to the stack (940) in two or more locations. For example, if the conductors (915) in the stack (940) have a low cross sectional area and/or are formed from lower conductivity material, it may be desirable to connect to the conductors (915) in multiple locations. For example, a first connection could be made ⅓ of the way from a first end of the conductors (915) and a second connection could be made at ⅔ of the length from the first end of the conductors (915).

FIG. 10 shows a top view of an alternative fan out example (1000) for making connections to the conductors (1015) in the stack (1010). In this example, the various layers of the stack (1010) are separated at the end so that the top surfaces of the conductors (1015) are exposed in a fan out configuration. Traces (1025) can then be connected to the exposed surfaces of each of the conductors (1015). The traces (1025) can connect the various conductors (1015) in the memory array to external circuitry such as addressing circuitry, CMOS switching elements, power supplies or other electronics.

FIG. 11 shows a different example (1100) where a number of vias (1120) penetrating through the stack (1140) to make electrical connections with each of the conductors (1115) in the stack (1140). In this example, the conductors (1115) terminate after making connection with a via (1120) to allow the adjacent via (1120) to make a connection to a conductor (1115) lower in the stack (1140).

Figure 12A:
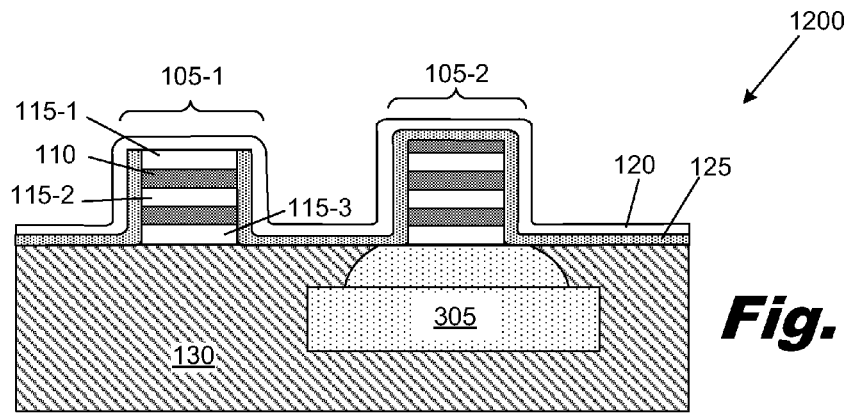
FIG. 12A-12D shows a variety of techniques that could be used for making electrical connections to conductors in the stacked resistive memory device, according to one example of principles described herein.
Figure 12B:
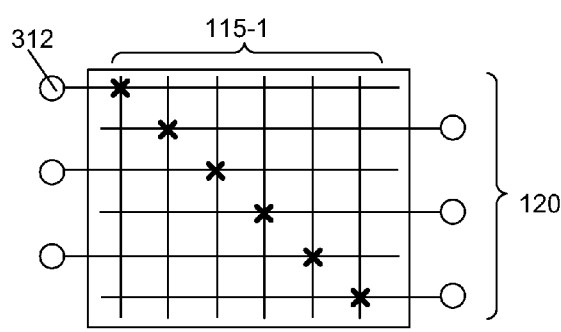

FIGS. 12A-D show various techniques that can be used to make connections between read out/control circuitry and the conductors (115) in the memory. FIG. 12A is a cross sectional diagram of one example of a stacked resistive memory device (1200). As discussed above, the stacks (105) include a number of alternating conductive and insulating layers. The top conductor (115-1) in the left stack (105-1) is exposed, so that it makes an electrical connection with the upper conductor ribbon (120) that passes over it. By selectively exposing portions of the top stack conductors, each top stack conductor can be connected to one of the upper conductors. The connected pairs of top stack conductors and upper conductors are connected to perimeter circuitry (312, FIG. 12B). FIG. 12B is a diagram showing the connection between the upper conductor ribbons (120) shown as horizontal lines and the top stack conductors (115-1), shown as vertical lines. Connections between the upper conductors and top stack conductors are shown by an "X". Perimeter vias (312) are shown as circles connected to the upper conductor ribbons (120).

Figure 12C:
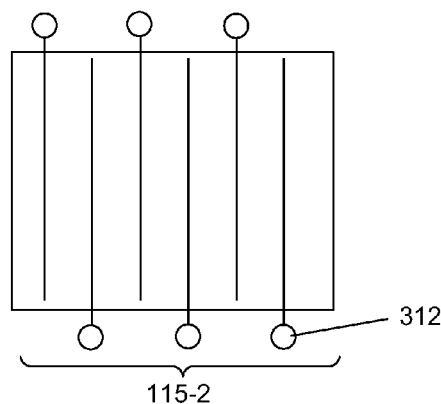

In this example, the middle conductors (115-2) exit the memory device and are connected to perimeter circuitry. This is shown in FIG. 12C. The middle conductors (115-2) are shown as vertical lines and the perimeter vias (312) connected to the perimeter circuitry are shown as circles. Alternating the side (top or bottom sides in this example) on which adjacent conductors (115-2) are connected to the perimeter circuitry allows for more room for the circuitry, which can be significantly more complex and take more room than the stacks and upper conductors which can be very densely packed.

Figure 12D:
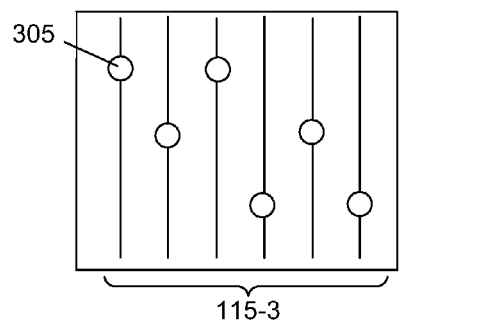

FIG. 12A and 12D show that the bottom stack conductors (115-3) are directly connected to area distributed circuitry (305) located under the stacks (105). Thus, in the example given above, three different connection techniques are used in single device. However, the connection techniques described can be used individually or in combination with other techniques.

The preceding description has been presented only to illustrate and describe examples of the principles. This description is not intended to be exhaustive or to limit these principles to any precise form disclosed. Many modifications and variations are possible in light of the above teaching.

What is claimed is:

1. A resistive memory device comprising:
   a stack comprising conductor layers and insulator layers, with edges of the conductor layers and insulating layers exposed on sides of the stack;
   an insulator disposed on a first side of the stack, in which the insulator covers exposed edges of the conductor layers on the first side of the stack;
   a memory layer disposed over the stack and insulator, such that the memory layer is in electrical contact with edges of the conductor layers on a second side of the stack but is insulated from edges on the first side of the stack by the insulator; and
   a conductive ribbon disposed over the memory layer to form programmable memory elements where the conductive ribbon crosses edges of the conductor layers on the second side of the stack.

2. The device of claim 1, in which the insulator is a shadow deposited layer.

3. The device of claim 1, in which the programmable memory elements switchably connect the conductor layers in the stack with the conductive ribbon.

4. The device of claim 1, in which the resistive memory device comprises a plurality of parallel stacks with a plurality of conductive ribbons crossing the stacks.

5. The device of claim 4, further comprising area distributed vias extending upward to connect to the conductive ribbons.

6. The device of claim 5, in which area distributed vias are electrically connected to bottom conductor layers in the stacks.

7. The device of claim 5, in which each area distributed via connects to both a conductive ribbon and one of the conductor layers in a stack.

8. The device of claim 5, in which the area distributed vias directly contact the memory layer and form programmable memory elements with the conductive layers.

9. The device of claim 1, further comprising dopant rich layers in the stack disposed adjacent to conductor layers in the stack.

10. The device of claim 9, in which the memory layer comprises transition metal oxides and oxygen vacancy dopants.

11. The device of claim 1, in which the memory layer comprises a dopant rich layer adjacent to the conductive ribbon and a dopant poor layer disposed adjacent to the stack.

12. The device of claim 1, further comprising exposing a top surface of a conductor in the stack such that a conductive ribbon passing over the stack makes direct electrical contact with the top surface of the conductor.

13. The device of claim 12, in which the exposed portions of the conductor layers comprise one of: a stair step geometry or a fan out geometry.

14. The device of claim 1, in which exposed portions of the conductor layers extend from an end of the stack, the device further comprising electrical connections between the exposed portions and control circuitry.

15. The device of claim 1 in which the conductor layers comprise carbon based structures.

16. The device of claim 1, in which the conductor layers comprise graphene.

17. A resistive memory device:
   a stack comprising a memory layer, in which edges of the memory layer are exposed on sides of the stack;
   a first electrode in electrical and mechanical contact with an edge of the memory layer exposed on a first side of the stack; and
   a second electrode in electrical and mechanical contact with an edge of the memory layer exposed on a second side of the stack;

in which the memory layer forms a programmable resistive switch connecting the first electrode and second electrode, and in which the memory layer comprises a resistive memory sublayer and a dopant reservoir sublayer.

18. The device of claim 17, wherein the stack comprises multiple memory layers separated by insulating layers, in which the multiple memory layers form parallel programmable resistive switches between the first electrode and second electrode.

19. A method for forming a resistive memory device comprises:

forming alternating conductive and insulating layers over a substrate;

patterning the layers to form a stack with exposed edges on a first side and second side of the stack;

forming an insulator on a first side of the stack to cover the exposed edges on the first side of the stack;

depositing a memory layer over the stack and insulator; and disposing a conductor ribbon over the memory layer.

20. The method of claim 19, in which patterning the layers comprises forming a mask over the alternating conductive and insulating layers using nanoimprinting.

* * * * *

UNITED STATES PATENT AND TRADEMARK OFFICE
CERTIFICATE OF CORRECTION

PATENT NO. : 8,829,581 B1
APPLICATION NO. : 13/866625
DATED : September 9, 2014
INVENTOR(S) : Shih-Yuan Wang et al.

It is certified that error appears in the above-identified patent and that said Letters Patent is hereby corrected as shown below:

On the Title Page

Item (72), Inventors, in column 1, line 3, delete "Mountian" and insert -- Mountain --, therefor.

Signed and Sealed this
Seventeenth Day of February, 2015

Michelle K. Lee
*Deputy Director of the United States Patent and Trademark Office*